(12) United States Patent
Omoto

(10) Patent No.: US 9,018,581 B2
(45) Date of Patent: Apr. 28, 2015

(54) TRANSMISSION ELECTRON MICROSCOPE

(71) Applicant: JEOL Ltd., Tokyo (JP)

(72) Inventor: Kazuya Omoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 13/757,939

(22) Filed: Feb. 4, 2013

(65) Prior Publication Data

US 2013/0206987 A1 Aug. 15, 2013

(30) Foreign Application Priority Data

Feb. 9, 2012 (JP) .................................. 2012-25903

(51) Int. Cl.
| | |
|---|---|
| *H01J 37/10* | (2006.01) |
| *H01J 37/153* | (2006.01) |
| *H01J 37/05* | (2006.01) |
| *H01J 37/04* | (2006.01) |
| *H01J 37/26* | (2006.01) |

(52) U.S. Cl.
CPC ................. *H01J 37/10* (2013.01); *H01J 37/05* (2013.01); *H01J 37/153* (2013.01); *H01J 37/04* (2013.01); *H01J 37/26* (2013.01); *H01J 2237/0492* (2013.01); *H01J 2237/057* (2013.01); *H01J 2237/1532* (2013.01)

(58) Field of Classification Search
CPC ................. H01J 37/26; H01J 2237/057; H01J 2237/2802; H01J 2237/0492; H01J 2237/05; H01J 2237/24475

USPC .................................. 250/311, 310, 306, 307
See application file for complete search history.

(56) References Cited

U.S. PATENT DOCUMENTS

| | | | |
|---|---|---|---|
| 2003/0006373 A1* | 1/2003 | Koguchi et al. ............... | 250/311 |
| 2005/0242284 A1* | 11/2005 | Kaneyama .................... | 250/310 |
| 2005/0285037 A1* | 12/2005 | Nakamura et al. ............ | 250/311 |
| 2009/0108200 A1* | 4/2009 | Wang ............................ | 250/311 |
| 2011/0210249 A1* | 9/2011 | Benner ......................... | 250/310 |
| 2011/0278451 A1* | 11/2011 | Tiemeijer et al. ............. | 250/307 |
| 2013/0126729 A1* | 5/2013 | Own et al. .................... | 250/307 |
| 2013/0234011 A2* | 9/2013 | Niebel et al. ................. | 250/307 |

FOREIGN PATENT DOCUMENTS

JP 20016601 A 1/2001

* cited by examiner

*Primary Examiner* — Nicole Ippolito
*Assistant Examiner* — Wyatt Stoffa
(74) *Attorney, Agent, or Firm* — The Webb Law Firm

(57) ABSTRACT

A transmission electron microscope (100) includes an electron beam source (2), an illumination lens (10), an objective lens (20), an intermediate lens system (30), a pair of transfer lenses (40) located behind the intermediate lens system (30), and an energy filter (60) for separating the electrons of the beam L transmitted through the specimen (S) according to energy. The transfer lenses (40) transfer the first image to the entrance crossover plane (S1) of the energy filter (60) and to transfer the second image to the entrance image plane (A1) of the filter (60). An image plane (A3) is formed between the first transfer lens (40a) and the second transfer lens (40b).

3 Claims, 4 Drawing Sheets

TRANSMISSION ELECTRON MICROSCOPE

BACKGROUND OF THE INVENTION

1. Field of the Invention

The present invention relates to a transmission electron microscope.

2. Description of Related Art

Electron energy loss spectroscopy (EELS) is a technique consisting of irradiating a specimen with an electron beam and obtaining a spectrum from the intensities of loss energy of electrons transmitted through the specimen. The energy that an electron loses within a specimen varies according to the constituent elements of the specimen, how atoms are bonded to each other, and other factors. Accordingly, the structure of the specimen can be known from its spectrum. An energy filter can image electrons having certain energies from electrons separated according to energy and so this instrument has attracted attention (see, for example, JP A-2001-6601).

In a transmission electron microscope (TEM) equipped with an energy filter, devices such as a dark-field detector for scanning transmission electron microscopy (STEM) and optical parts such as an entrance aperture for limiting the field of view for electrons incident on the energy filter are preferably disposed at the entrance image plane of the energy filter.

However, because of mechanical restrictions, it is impossible to arrange an STEM dark-field detector, an entrance aperture, and other parts at the incident image plane of the energy filter. Therefore, such STEM dark-field detector and entrance aperture are located off the position of the entrance image plane of the energy filter.

SUMMARY OF THE INVENTION

In view of the foregoing problem, the present invention has been made. According to some aspects of the invention, it is possible to offer transmission electron microscopes in which devices such as detectors and optical components can be effectively arranged.

(1) A transmission electron microscope associated with the present invention has: an electron beam source producing an electron beam; an illumination lens via which the electron beam from the electron beam source is directed at a specimen; an objective lens for forming a focused first image from the electron beam transmitted through the specimen; an intermediate lens system for forming a focused second image from the electron beam transmitted through the specimen; a pair of transfer lenses disposed behind the intermediate lens system; and an energy filter for separating the electrons of the electron beam transmitted through the specimen according to energy. The energy filter has an entrance crossover plane to which the first image is transferred by the pair of transfer lenses made up of first and second transfer lenses. The energy filter also has an entrance image plane to which the second image is transferred by the transfer lenses. An image plane is formed between the first and second transfer lenses of the pair of transfer lenses. According to this transmission electron microscope, an image plane is formed between the first and second transfer lenses and, therefore, devices such as detectors and optical components can be effectively arranged in this image plane.

(2) In one feature of this transmission electron microscope, a detector for detecting electrons scattered by the specimen may be disposed at the image plane between the first and second transfer lenses. This transmission electron microscope permits the detector to be arranged effectively.

(3) In another feature of this transmission electron microscope, an entrance aperture for determining the angular aperture of the electron beam impinging on the energy filter may be disposed at the image plane between the first and second transfer lenses. This transmission electron microscope permits the entrance aperture to be arranged effectively.

(4) In a further feature of this transmission electron microscope, a deflection coil for deflecting the electron beam impinging on the energy filter may be disposed at the image plane between the first and second transfer lenses. This transmission electron microscope permits the deflection coil to be arranged effectively.

(5) In an additional feature of this transmission electron microscope, stigmator coils for correcting aberration produced by the energy filter may be disposed at the image plane between the first and second transfer lenses. This transmission electron microscope permits the stigmator coils to be arranged effectively.

(6) In a still other feature of this transmission electron microscope, the first image may be a diffraction pattern, while the second image may be a specimen image.

(7) In a yet other feature of this transmission electron microscope, the first image may be a specimen image, while the second image may be a diffraction pattern.

DESCRIPTION OF THE PREFERRED EMBODIMENTS

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. Transmission Electron Microscope

Figure 1:
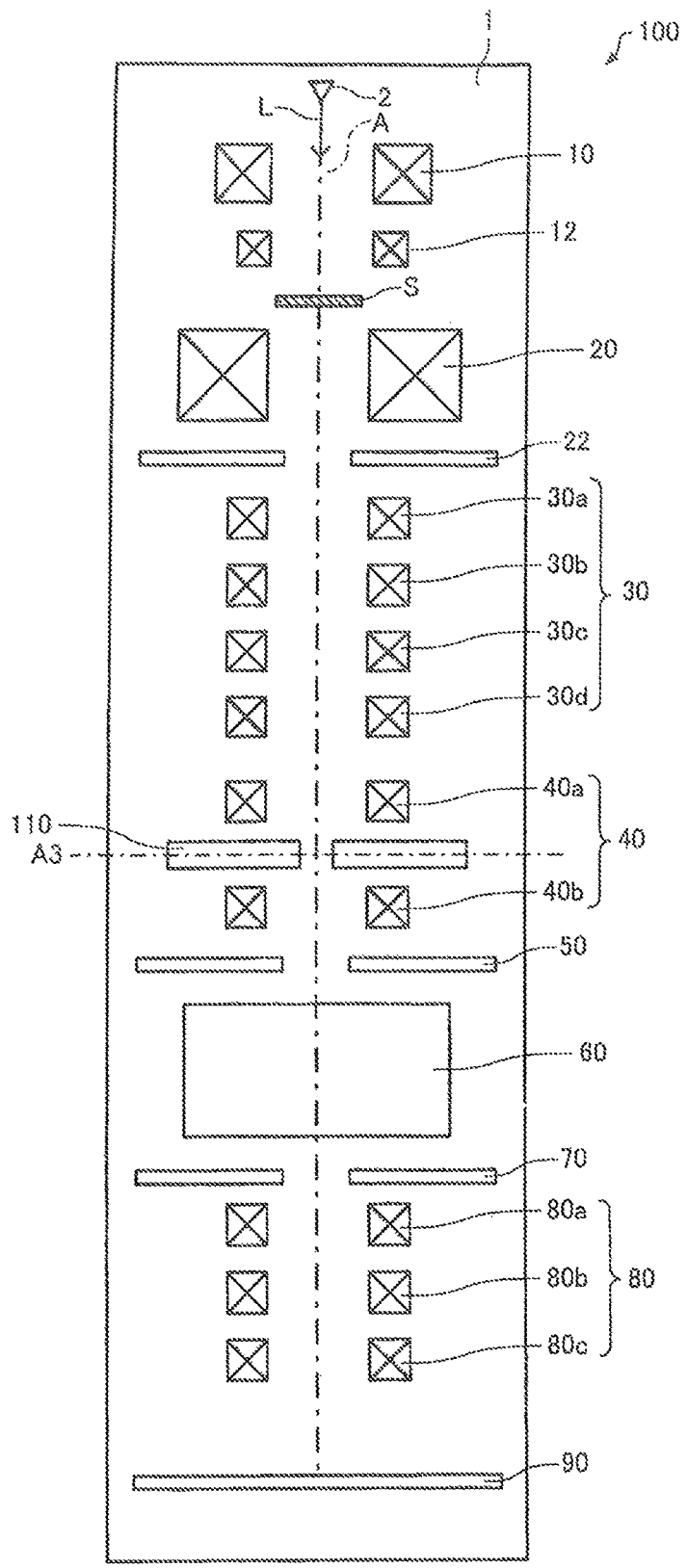
FIG. 1 is a vertical cross section of a transmission electron microscope associated with one embodiment of the present invention, showing the structure of the microscope.

The configuration of a transmission electron microscope of one embodiment of the present invention is first described by referring to FIG. 1, where the microscope is indicated by reference numeral 100. This microscope 100 is configured including an electron beam source 2, an illumination lens 10, scan coils 12, an objective lens 20, a field-limiting aperture (selected area aperture) 22, an intermediate lens system 30, a pair of transfer lenses 40 (including a first transfer lens 40a and a second transfer lens 40b), an entrance aperture 50, an energy filter 60, an energy-selecting slit 70, projector lenses 80, a fluorescent screen 90, and a dark-field detector 110.

In the transmission electron microscope 100, the electron beam source 2, illumination lens 10, scan coils 12, objective lens 20, field-limiting aperture 22, intermediate lens system 30, first transfer lens 40a, dark-field detector 110, second transfer lens 40b, entrance aperture 50, energy filter 60, energy-selecting slit 70, projector lenses 80, and screen 90 are arranged in this order along the optical axis A of the microscope 100 and accommodated within an electron optical column 1. The optical axis A of the microscope 100 is a virtual line interconnecting the centers of the lenses 10, 20, 30, 40, and 80. The inside of the electron optical column 1 is evacuated by vacuum pumping equipment (not shown).

The electron beam source 2 produces an electron beam L by accelerating electrons by means of an anode, the electrons being released from a cathode. A well-known electron gun can be used as the electron beam source 2.

The illumination lens 10 is used to direct the electron beam L produced from the electron beam source 2 at a specimen S. The illumination lens 10 may be composed of plural lens elements (not shown). The illumination lens 10 can adjust the dose of the electron beam hitting the specimen S. Furthermore, the illumination lens 10 can focus the electron beam L onto the specimen S. Consequently, a quite small probe can be created on the specimen S.

The scan coils 12 are disposed between the illumination lens 10 and the objective lens 20. The scan coils 12 are electromagnetic coils used to scan the electron beam L (quite small probe) emitted from the illumination lens 10 over the specimen S.

The objective lens 20 and intermediate lens system 30 are used to create an electron microscope image from the electron beam L transmitted through the specimen S. Electron microscope images referred to herein are images that can be obtained by the transmission electron microscope 100, and include bright-field images, dark-field images, magnified images of the specimen (including lattice images), and diffraction patterns obtained by electron diffraction.

The transmission electron microscope 100 can operate either in a TEM imaging mode in which a specimen image is obtained or in an electron diffraction mode in which a diffraction pattern or an STEM (scanning transmission electron microscope) image mode is obtained.

The objective lens 20 is located behind the illumination lens 10, i.e., the illumination lens 10 is located on the upstream side (that is, as viewed along the electron beam) of the objective lens 20. The objective lens 20 is the first stage of lens for focusing the electron beam L transmitted through the specimen S.

The intermediate lens system 30 is located behind the objective lens 20. In the illustrated example, the intermediate lens system 30 is composed of four stages of lenses (first intermediate lens 30a, second intermediate lens 30b, third intermediate lens 30c, and fourth intermediate lens 30d). The four lenses 30a, 30b, 30c, and 30d cooperate such that the magnification, image rotation, image focusing, and crossover focusing can be adjusted.

The field-limiting aperture 22 is disposed at the image plane of the objective lens 20, i.e., at the object plane of the intermediate lens system 30. The field-limiting aperture 22 is used to restrict the area of the specimen S from which a diffraction pattern is obtained when selected-area diffraction is performed.

The first transfer lens 40a is located behind the fourth intermediate lens 30d of the intermediate lens system 30. The second transfer lens 40b is located behind the first transfer lens 40a. The first transfer lens 40a and second transfer lens 40b together constitute a pair of transfer lenses 40. The pair of transfer lenses 40 is located behind the intermediate lens system 30. In the illustrated example, the pair of transfer lenses 40 is located between the intermediate lens system 30 and the energy filter 60.

The pair of transfer lenses 40 consists of lenses for achieving imaging, for example, in a 1:1 magnification relationship and acts to transfer images conjugate to the images formed by the objective lens 20 and intermediate lens system 30, respectively, to a subsequent stage. In particular, in the TEM imaging mode, the transfer lenses 40 transfer a diffraction pattern formed at the crossover position of the intermediate lens system 30 to the entrance crossover plane of the energy filter 60. Also, the transfer lenses 40 transfer a specimen image formed at the image plane of the intermediate lens system 30 to the entrance image plane of the energy filter 60. In the electron diffraction mode, the transfer lenses 40 transfer a specimen image formed at the crossover position of the intermediate lens system 30 to the entrance crossover plane of the energy filter 60, and transfer a diffraction pattern formed at the image plane of the intermediate lens system 30 to the entrance image plane of the energy filter 60. That is, the transfer lenses 40 form an image, which is conjugate to the electron microscope image formed at the crossover position of the intermediate lens system 30, at the entrance crossover plane of the energy filter 60. Also, the transfer lenses 40 form an image, which is conjugate to the electron microscope image formed at the image plane of the intermediate lens system 30, at the entrance image plane of the energy filter 60.

An image plane A3 of the first transfer lens 40a is formed between the first transfer lens 40a and the second transfer lens 40b. In this image plane A3, a specimen image is formed in the TEM imaging mode and a diffraction pattern is formed in the electron diffraction mode.

The entrance aperture 50 limits the dose of the electron beam L impinging on the energy filter 60 to thereby determine the aperture angle of the beam hitting the filter 60. The entrance aperture 50 makes it possible to obtain high-resolution spectra relatively free from aberration effects.

In the illustrated example, the entrance aperture 50 is disposed between the second transfer lens 40b and the energy filter 60. Alternatively, the aperture 50 may be located between the dark-field detector 110 and the second transfer lens 40b. That is, the entrance aperture 50 may be positioned near the image plane A3 where the dark-field detector 110 is disposed.

The energy filter 60 is located behind the second transfer lens 40b of the transfer lens pair 40. The energy filter 60 is positioned between the transfer lens pair 40 and the projector lenses 80. The electron beam L transmitted through the specimen S is separated according to energy by the energy filter 60. Specifically, the energy filter 60 selects only electrons having a certain energy from electrons transmitted through the specimen S. For example, by selecting only elastically scattered electrons by the use of the energy filter 60, the background due to inelastically scattered electrons is removed and so a clear specimen image can be obtained. Also, accurate structural information can be gained. Furthermore, by selecting an absorption edge energy of a certain atom using the energy filter 60, the element can be mapped.

For example, the energy filter 60 is an Omega filter that is an in-column energy filter. It is to be noted that the energy filter 60 is not restricted to an Omega filter. The energy filter may be another in-column energy filter such as a gamma filter, mandolin filter, alpha filter, or the like.

The energy filter 60 has an entrance crossover plane, an entrance image plane, an exit crossover plane (energy spectrum plane), and an exit image plane (achromatic plane). At the exit crossover plane, energy dispersion occurs. At the exit image plane, there is no energy dispersion. The energy filter 60 has a focusing function similarly to an electron lens. The entrance crossover plane is projected to the exit crossover plane. The entrance image plane is projected to the exit image plane.

The projector lenses 80 are located behind the energy filter 60. In the illustrated example, the projector lenses 80 are made up of three stages of lenses (first projector lens 80a, second projector lens 80b, and third projector lens 80c). The plane of the projector lenses 80 projected onto the screen 90 can be varied. For example, where an energy loss image is obtained, the projector lenses 80 image their exit image plane onto the screen 90. Especially, the microscope 100 can obtain an energy loss image (element distribution image) intrinsic to a certain element by selecting only electrons having a loss energy determined by the element by the use of the energy-selecting slit 70 disposed at the exit crossover plane. Where an energy spectrum is obtained, the projector lenses 80 image their exit crossover plane onto the screen 90.

The dark-field detector 110 is disposed between the first transfer lens 40a and the second transfer lens 40b. More specifically, the detector 110 is positioned at the image plane A3 of the first transfer lens 40a formed between the transfer lenses 40a and 40b, and operates to detect electrons scattered by the specimen S. The dark-field detector 110 is an annular detector for obtaining a dark-field image by STEM (scanning transmission electron microscopy).

2. Operation of the Transmission Electron Microscope

Figure 2:
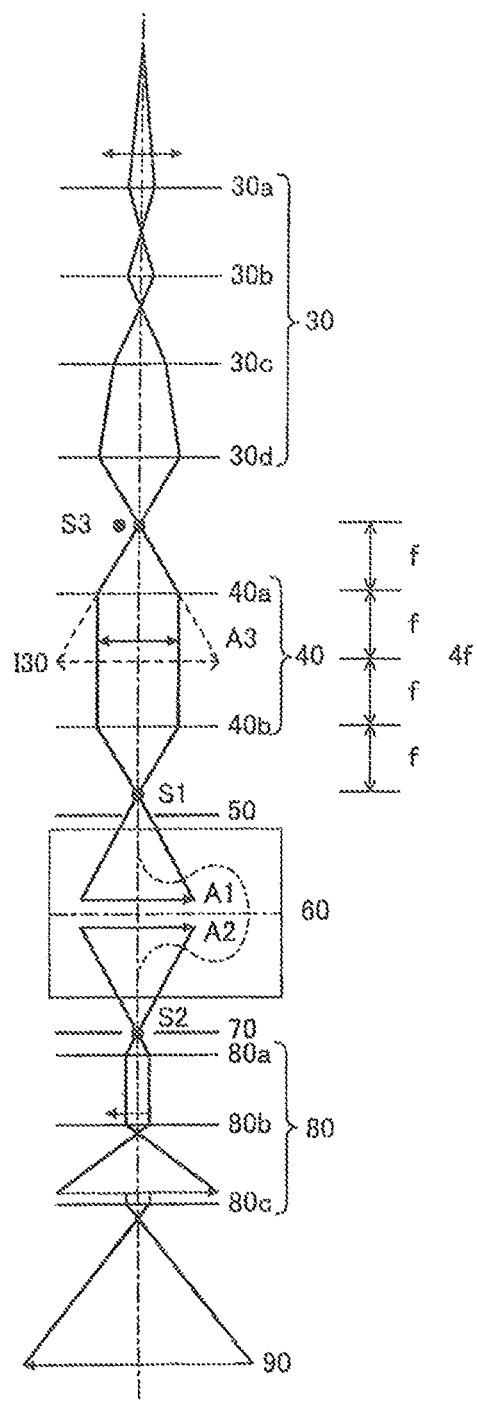
FIG. 2 is an electron ray diagram illustrating the operation of the transmission electron microscope shown in FIG. 1 in TEM imaging mode.

The operation of the transmission electron microscope 100 is next described. The operation of the microscope 100 when it is in the TEM imaging mode is first described. FIG. 2 illustrates the operation of the transmission electron microscope 100 in the TEM imaging mode. In FIG. 2, for the sake of convenience, the electron beam source 2, illumination lens 10, scan coils 12, field-limiting aperture 22, and the dark-field detector 110 are omitted from being shown.

In the transmission electron microscope 100, the electron beam L released from the electron beam source 2 is made to hit the specimen S via the illumination lens 10. The electron beam L transmitted through the specimen S undergoes a lens action from the objective lens 20 and intermediate lens system 30. As a result, a specimen image and a diffraction pattern are formed. In particular, the specimen image is formed at the image plane 130 of the intermediate lens system 30. A diffraction pattern is formed at the crossover position S3 of the intermediate lens system 30.

The transfer lens pair 40 transfer the specimen image and diffraction pattern formed by the objective lens 20 and intermediate lens system 30. Specifically, the transfer lens pair 40 transfer the specimen image formed at the image plane 130 of the intermediate lens system 30 to the entrance image plane A1 of the energy filter 60. That is, the transfer lens pair 40 form an image, which is conjugate to the specimen image formed at the image plane 130 of the intermediate lens system 30, at the entrance image plane A1. Also, the transfer lens pair 40 transfer the diffraction pattern, which is formed at the crossover position S3 of the intermediate lens 30, to the entrance crossover plane S1 of the energy filter 60. That is, the transfer lens pair 40 form an image, which is conjugate to the diffraction pattern formed at the crossover position S3, at the entrance crossover plane S1. Furthermore, the transfer lens pair 40 form a specimen image at the image plane A3 of the first transfer lens 40a between the first transfer lens 40a and the second transfer lens 40b. That is, the transfer lens pair 40 form an image, which is conjugate to the specimen image formed at the image plane 130, at the image plane A3. In this way, the transfer lens pair 40 focus the specimen image and diffraction pattern formed by the objective lens 20 and intermediate lens system 30 in a 1:1 magnification relationship. That is, the magnification of the transfer lens pair 40 is 1×.

The energy filter 60 projects the specimen image, which is formed at the entrance image plane A1, onto the exit image plane A2. Furthermore, the energy filter 60 projects the diffraction pattern, which is formed at the entrance crossover plane S1, onto the exit crossover plane S2.

The energy-selecting slit 70 selects only electrons having a loss energy attributing to a certain element.

The projector lenses 80 image the exit image plane A2 onto the screen 90. Consequently, an energy loss image of the specimen that is intrinsic to the element selected by the energy-selecting slit 70 is formed on the screen 90.

Figure 3:
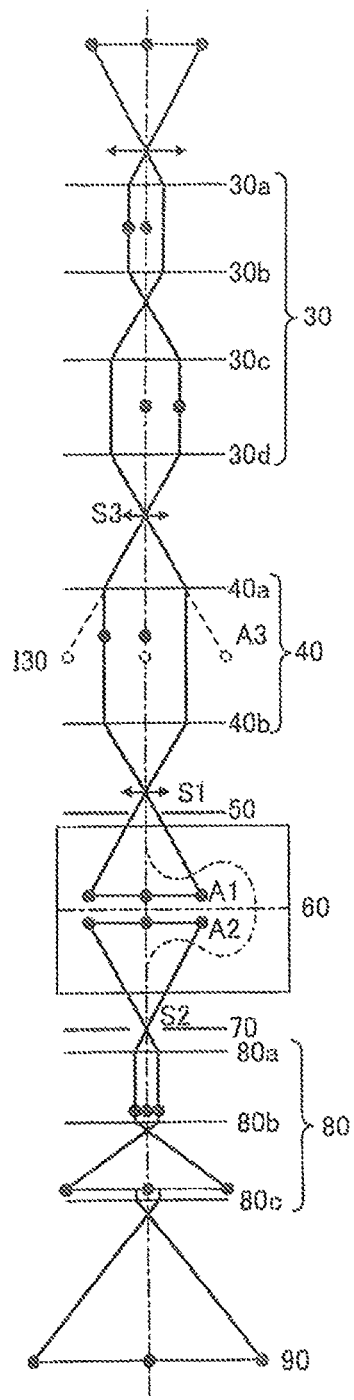
FIG. 3 is a diagram similar to FIG. 2, but in which the microscope is operating in electron diffraction mode.

The operation of the transmission electron microscope 100 in the electron diffraction mode is next described. FIG. 3 illustrates the operation of the microscope 100 in the electron diffraction mode. In FIG. 3, for the sake of convenience, the electron beam source 2, illumination lens 10, scan coils 12, field-limiting aperture 22, and dark-field detector 110 are omitted from being shown.

In the transmission electron microscope 100, the electron beam L released from the electron beam source 2 is made to hit the specimen S via the illumination lens 10. At this time, the beam L is sharply focused, for example, and scanned over the specimen S by the scan coils 12. The electron beam L transmitted through the specimen S undergoes a lens action from the objective lens 20 and intermediate lens system 30. As a consequence, a specimen image and a diffraction pattern are formed. In particular, an image of the diffraction pattern is formed at the image plane 130 of the intermediate lens system 30. A specimen image is formed at the crossover position S3 of the intermediate lens system 30.

The transfer lens pair 40 transfer the specimen image and diffraction pattern formed by the objective lens 20 and intermediate lens system 30. Specifically, the transfer lens pair 40 transfer the diffraction pattern formed at the image plane 130 of the intermediate lens system 30 to the entrance image plane A1 of the energy filter 60. That is, the transfer lens pair 40 form an image, which is conjugate to the diffraction pattern formed at the image plane 130 of the intermediate lens system 30, at the entrance image plane A1. Also, the transfer lens pair 40 transfer the specimen image, which is formed at the crossover position S3 of the intermediate lens system 30, to the entrance crossover plane S1 of the energy filter 60. That is, the transfer lens pair 40 form an image, which is conjugate to the specimen image formed at the crossover position S3, at the entrance crossover plane S1. Also, the transfer lens pair 40 form a diffraction pattern at the image plane A3 of the first transfer lens 40a between the first transfer lens 40a and the second transfer lens 40b. That is, the transfer lens pair 40 form an image, which is conjugate to the diffraction pattern formed at the image plane 130, at the image plane A3. In this way, the transfer lens pair 40 focus the specimen image and diffraction pattern formed by the objective lens 20 and intermediate lens system 30 in a 1:1 magnification relationship. In other words, the magnification of the transfer lens pair 40 is 1×.

The energy filter 60 projects the diffraction pattern, which is formed at the entrance image plane A1, onto the exit image plane A2. Also, the energy filter 60 projects the specimen image, which is formed at the entrance crossover plane S1, onto the exit crossover plane S2. The energy-selecting slit 70 selects only electrons having a loss energy determined by a certain element.

The projector lenses 80 image the exit image plane A2 onto the screen 90. For example, STEM image data may be obtained by placing an STEM detector (not shown) for detecting transmitted electrons at the position of the screen 90 and obtaining the output signal from the STEM detector in association with or in synchronism with the scanning of the electron beam L. Consequently, an energy loss image (specimen image or STEM image) intrinsic to the element selected by the energy-selecting slit 70 is formed.

The transmission electron microscope 100 associated with the present embodiment has the following features. In the transmission electron microscope 100, the transfer lens pair 40 transfer a first image (a diffraction pattern in the TEM imaging mode and a specimen image in the electron diffraction mode) to the entrance crossover plane S1 of the energy filter 60. The lens pair 40 transfer a second image (a specimen image in the TEM imaging mode and a diffraction pattern in the electron diffraction mode) to the entrance image plane A1 of the energy filter 60. The image plane A3 is formed between the first transfer lens 40a and the second transfer lens 40b of the transfer lens pair 40. Consequently, the dark-field detector 110 can be positioned at the image plane A3. Accordingly, the dark-field detector can be arranged efficiently for the reason described below.

Preferably, the dark-field detector is disposed at the entrance image plane of the energy filter. Where the dark-field detector is disposed outside the entrance image plane, the detector may be more sensitive to beam deviations produced, for example, during electron beam scanning. This may produce image contrast artifacts. However, because of mechanical restrictions, it is impossible to dispose a dark-field detector at the entrance image plane of the energy filter.

The transmission electron microscope 100 does not suffer from this problem because the image plane A3 is formed by the transfer lens pair 40. Rather, the dark-field detector can be disposed efficiently. Furthermore, the transfer lens pair 40 can transfer focused images to a subsequent stage such that the final images have a 1:1 magnification relationship as if the transfer lens pair 40 were not present. Furthermore, the image plane A3 focused stationarily ahead of the entrance image plane A1 of the energy filter 60 can be formed by fixing the excitation of the second transfer lens 40b. As a consequence, reproducible optical adjustments can be accomplished.

Furthermore, the crossover position S3 of the intermediate lens system 30 can be shifted toward the fourth intermediate lens 30d by lowering the degree of excitation of the first transfer lens 40a than where excitation under the 1:1 magnification imaging condition is provided. This reduces the ratio of the image size at the image plane formed ahead of the fourth intermediate lens 30d to the image size at the final image plane. That is, the magnification factor increases. Therefore, the whole imaging system of the transmission electron microscope can more easily achieve higher-magnification imaging. Accordingly, the second intermediate lens 30b for creating high-magnification images can be made a weaker lens. This leads to a decrease in the size of the second intermediate lens 30b. As a result, the electron optical column can be shortened. Hence, an optical system that covers from a high magnification to a low magnification can be built while suppressing increases in the length of the column.

In the example shown in FIGS. 2 and 3, it is assumed that the dark-field detector 110 has a diameter of 150 μm, the distance between the entrance crossover plane S1 and the entrance image plane A1 is 100 mm, and the transfer lenses 40a and 40b have a focal distance f of 30 mm. An image that is 0.3 times as large as the image formed at the entrance image plane A1 is formed at the image plane A3. Assuming that a camera length defined at the entrance image plane A1 is 3 mm, the STEM image pickup angle of the dark-field detector is 83 mrad. Thus, optimum camera lengths of 3 to 4 mm can be accomplished.

3. Modification of the Transmission Electron Microscope

Figure 4:
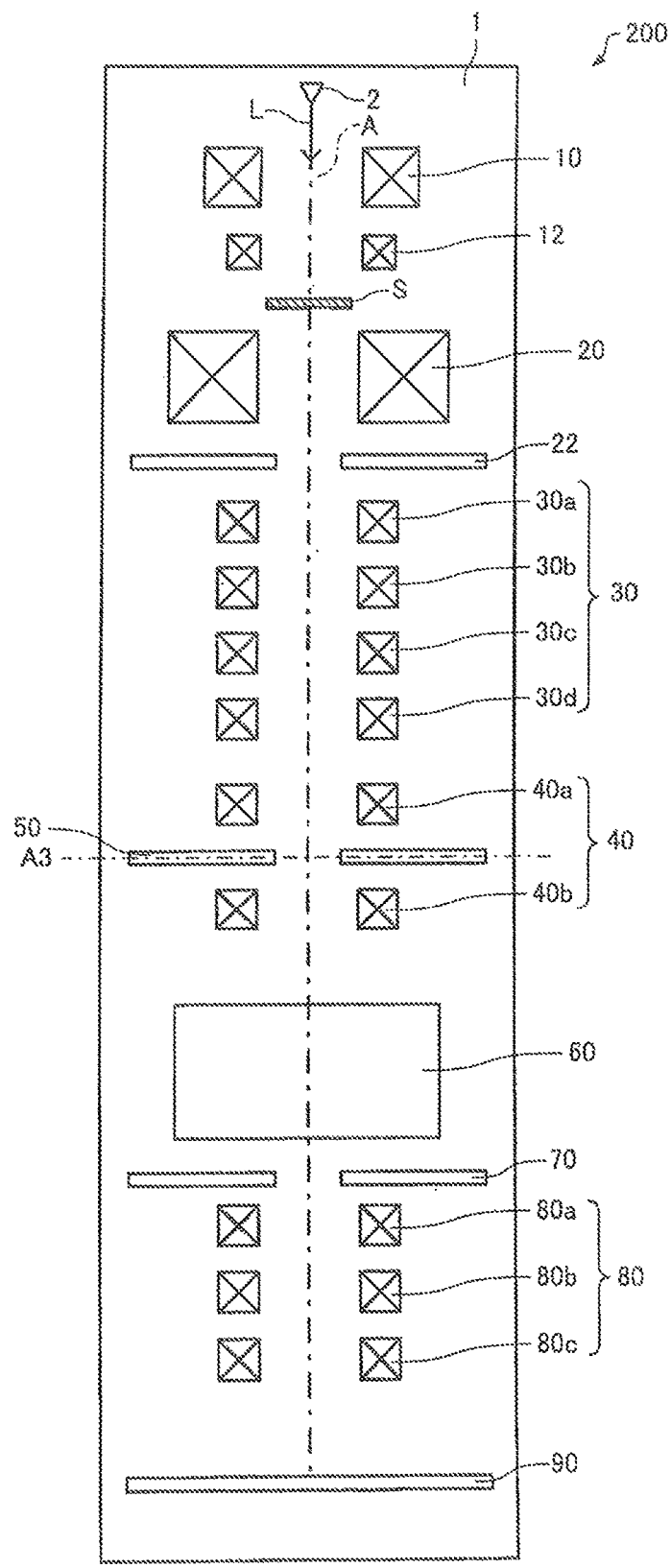
FIG. 4 is a vertical cross section of a transmission electron microscope associated with a modification of the above-described embodiment of the invention, showing the structure of the microscope.

A modification of the transmission electron microscope associated with the present embodiment is next described by referring to FIG. 4 which depicts the structure of the microscope. In FIG. 4, the microscope is generally indicated by reference numeral 200. Those components of the transmission electron microscope 200, which are similar in function with their counterparts of the transmission electron microscope 100, are indicated by the same reference numerals as in the figures already referenced in describing the microscope 100 and their detailed description will be omitted.

In the above example of the transmission electron microscope 100, the dark-field detector 110 is disposed at the image plane A3 as shown in FIG. 1. In contrast, in the transmission electron microscope 200, the entrance aperture 50 is disposed at the image plane A3.

In the transmission electron microscope 200, the transfer lens pair 40 transfer the first image (a diffraction pattern in the TEM imaging mode and a specimen image in the electron diffraction mode) to the entrance crossover plane S1 of the energy filter 60, and transfer the second image (a specimen image in the TEM imaging mode and a diffraction pattern in the electron diffraction pattern) to the entrance image plane A1 of the filter 60. The image plane A3 is formed between the first transfer lens 40a and the second transfer lens 40b of the transfer lens pair 40, in the same way as in the transmission electron microscope 100. In the transmission electron microscope 200, the entrance aperture 50 can be disposed in this image plane A3 and so the entrance aperture 50 can be arranged efficiently. For example, if the entrance aperture were located off the entrance image plane, the instrument would be more sensitive to beam deviations caused during electron beam scanning. This may result in image contrast artifacts. The transmission electron microscope 200 is free from this problem.

The placement of the entrance aperture 50 acting as an indicia at the image plane A3 is also useful for making optical adjustments.

For example, where the diameter of the entrance aperture 50 is 60 mm, the distance between the entrance crossover plane S1 and the entrance image plane A1 is 100 mm, and the focal distance f of the transfer lenses 40a, 40b is 30 mm, the image formed at the image plane A3 is 0.3 times as large as the image formed at the entrance image plane A1. If the camera length defined at the entrance image plane A1 is 3 mm, the EELS imaging pickup angle at the entrance aperture 50 is 1.0 mrad. Thus, optimum camera lengths of 3 to 4 mm can be accomplished.

It is to be understood that the present invention is not restricted to the above-described embodiment and modification but rather various changes and modifications are possible within the scope and spirit of the invention.

For instance, in the above-described example of the transmission electron microscope 100, the dark-field detector 110 is disposed at the image plane A3 as shown in FIG. 1. In the example of the transmission electron microscope 200, the entrance aperture 50 is disposed at the image plane A3 as shown in FIG. 4. The present invention is not restricted to these examples. Other optical components and devices such as detectors may also be disposed. For example, a deflection coil for deflecting the electron beam hitting the energy filter 60 may be disposed at the image plane A3. In this case, the spectral position can be adjusted. Additionally, stigmator coils for correcting aberrations produced by the energy filter 60 may be positioned at the image plane A3. In this case, the spectrum can be stigmated.

The present invention embraces configurations (e.g., configurations identical in function, method, and results or identical in purpose and advantageous effects) which are substantially identical to the configurations described in the above embodiment and modification. Furthermore, the invention embraces configurations which are similar to the configurations described in the above embodiment except that its nonessential portions have been replaced. Additionally, the invention embraces configurations which are identical in advantageous effects to or which can achieve the same object as the configurations described in the above embodiment. Further, the invention embraces configurations which are similar to the configurations described in the above embodiment except that a well-known technique is added.

Having thus described my invention with the detail and particularity required by the Patent Laws, what is desired protected by Letters Patent is set forth in the following claims.

The invention claimed is:

1. A transmission electron microscope comprising:
   an electron beam source producing an electron beam;
   an illumination lens via which the electron beam from the electron beam source is directed at a specimen;
   an objective lens and an intermediate lens system for forming a first image (S3) at a crossover position of the intermediate lens system from the electron beam transmitted through the specimen and for forming a second image (A3) at an image plane of the intermediate lens system from the electron beam transmitted through the specimen;
   a pair of transfer lenses disposed behind the intermediate lens system, the pair of transfer lenses being made up of a first transfer lens and a second transfer lens; and
   an energy filter for separating the electrons of the electron beam transmitted through the specimen according to energy,
   wherein the transfer lenses act to transfer the first image (S3) to an entrance crossover plane (S1) of the energy filter under the magnification of at least one and to transfer the second image (A3) to an entrance image plane (A1) of the energy filter under the magnification of at least one; and
   wherein an image plane is formed between the first transfer lens and the second transfer lens of the pair of transfer lenses and wherein a detector for detecting electrons scattered by the specimen is disposed at said image plane between said first and second transfer lenses.

2. A transmission electron microscope as set forth in claim 1, wherein said first image is a diffraction pattern, while said second image is a specimen image.

3. A transmission electron microscope as set forth in claim 1, wherein said first image is a specimen image, while said second image is a diffraction pattern.

* * * * *